(12) United States Patent
Huang

(10) Patent No.: US 9,359,043 B2
(45) Date of Patent: Jun. 7, 2016

(54) POWER ASSISTANCE BICYCLE USING SENSOR HAVING MULTIPLE MAGNET BLOCKS EVENLY DISTRIBUTED IN HOUSING

(71) Applicants: CHENGDU KUANHE TECHNOLOGY CO., LTD., Chengdu, Sichuan (CN); Qiang Huang, Chengdu, Sichuan (CN); Song Gao, Chengdu, Sichuan (CN); Yanxiong Ouyang, Chengdu, Sichuan (CN)

(72) Inventor: Qiang Huang, Sichuan (CN)

(73) Assignees: CHENGDU KUANHE TECHNOLOGY CO., LTD., Chengdu, Sichuan (CN); Qiang Huang, Chengdu, Sichuan (CN); Song Gao, Chengdu, Sichuan (CN); Yanxiong Ouyang, Chengdu, Sichuan (CN)

( * ) Notice: Subject to any disclaimer, the term of this patent is extended or adjusted under 35 U.S.C. 154(b) by 0 days.

(21) Appl. No.: 14/417,792

(22) PCT Filed: Jun. 5, 2013

(86) PCT No.: PCT/CN2013/076810
§ 371 (c)(1),
(2) Date: Jan. 28, 2015

(87) PCT Pub. No.: WO2014/019410
PCT Pub. Date: Feb. 6, 2014

(65) Prior Publication Data
US 2015/0203172 A1 Jul. 23, 2015

(30) Foreign Application Priority Data

Jul. 28, 2012 (CN) .......................... 2012 1 0263521

(51) Int. Cl.
*B62M 6/50* (2010.01)
*B62M 6/65* (2010.01)
*G01D 5/245* (2006.01)
(Continued)

(52) U.S. Cl.
CPC . *B62M 6/50* (2013.01); *B62M 6/55* (2013.01); *B62M 6/65* (2013.01); *B62M 6/90* (2013.01);
(Continued)

(58) Field of Classification Search
CPC ........ B60K 7/0007; B62M 6/00; B62M 6/40; B62M 6/45; B62M 6/50; B62M 6/60; B62M 6/65
See application file for complete search history.

(56) References Cited

U.S. PATENT DOCUMENTS 5,788,007 A * 8/1998 Miekka ...................... 180/205.1
6,163,148 A * 12/2000 Takada et al. ................. 324/226
(Continued)

*Primary Examiner* — Joseph Rocca
*Assistant Examiner* — Marc A Scharich

(57) ABSTRACT

A power-assistance bicycle using a sensor having multiple magnet blocks evenly distributed in a housing, related to electric power-assistance bicycles that provide a power-assistance signal with multipoint magnetic induction. The sensor comprises: a sensing element, a power-assisted model processor, a digital-to-analog converter and an operational amplifier. The sensing element comprises a rotating disk and an annular-groove fixing disk fitted with each other, and a permanent magnetic block and the Hall element are provided in a cavity of the rotating disk and the annular-groove fixing disk. A plurality of permanent magnetic blocks that are opposite in adjacent magnetic polarities are fixedly provided on the rotating disk. The Hall element is provided on the fixing disk and in proximity to the permanent magnetic blocks. The sensor is sleeved on an exterior of a medial axis. The operational amplifier is connected with the motor controller.

20 Claims, 6 Drawing Sheets

(51) Int. Cl.
*G01P 3/487* (2006.01)
*B62M 6/90* (2010.01)
*G01D 5/14* (2006.01)
*H03M 1/12* (2006.01)
*B62M 6/55* (2010.01)
*H03M 1/24* (2006.01)

(52) U.S. Cl.
CPC .............. *G01D 5/142* (2013.01); *G01D 5/2451* (2013.01); *G01P 3/487* (2013.01); *H03M 1/12* (2013.01); *H03M 1/245* (2013.01)

(56) References Cited

U.S. PATENT DOCUMENTS

| | | | |
|---|---|---|---|
| 6,247,548 B1* | 6/2001 | Hayashi et al. | 180/206.2 |
| 6,355,996 B1* | 3/2002 | Birkestrand | 310/54 |
| 7,191,861 B2* | 3/2007 | Bui | 180/206.1 |
| 2005/0077096 A1* | 4/2005 | Kokatsu et al. | 180/205 |
| 2005/0246152 A1* | 11/2005 | Kokatsu et al. | 703/22 |
| 2011/0285328 A1* | 11/2011 | Rittenhouse | 318/3 |
| 2013/0054065 A1* | 2/2013 | Komatsu | 701/22 |

* cited by examiner

US 9,359,043 B2

POWER ASSISTANCE BICYCLE USING SENSOR HAVING MULTIPLE MAGNET BLOCKS EVENLY DISTRIBUTED IN HOUSING

CROSS REFERENCE OF RELATED APPLICATION

This is a U.S. National Stage under 35 U.S.C 371 of the International Application PCT/CN2013/076810, filed Jun. 5, 2013, which claims priority under 35 U.S.C. 119(a-d) to CN 201210263521.7, filed Jul. 28, 2012.

BACKGROUND OF THE PRESENT INVENTION

1. Field of Invention

The present invention relates to the field of a power-assist bicycle, and more particularly to an electric power-assist bicycle for providing a power-assist signal by performing multi-point magnetic induction on a rotating component.

2. Description of Related Arts

A Chinese patent application having an application number of CN 201020295192.0 by Yebao automotive materials Industry Co. Ltd disclosed a power assistance bicycle dedicated sensing device which is cooperated by a magnetic part and a flexible assembly and capable of sensing torque. After a long time utilization, changes of spring constants of the flexible assembly lead to changes of control effects of the sensing signal and the controlled motor, so that the control effects can not meet the requirements of people's assistance. In addition, the flexible assembly has a complicated structure and a high cost.

A Chinese patent application "automatic detection device for electric assistance bicycle" with a publication number of 01201843.0 by Beijing University of Science and Technology discloses an automatic detection device for an electric assistance bicycle. The device detects the pedal force, the speed and the steering without contacting. In the device, discs are respectively provided on an inner wheel disc and an outer wheel disc which moves relatively. A spring is provided on the inner wheel disc. The spring is provided between the inner wheel disc and the outer wheel disc for resetting. Two Hall elements on a support detect electrical signals generated by relatively moved discs on the inner wheel disc and the outer wheel disc to represent the pedal force, the speed and the steering.

Disadvantages of the devices mentioned above are as follows.

Disadvantage (1)

The flexible assembly utilized is not durable. After a time of utilization, changes of spring constant of the flexible assembly lead to control effect changes of the controlled motor, so that the control effects can not meet the requirements of people's assistance. In addition, the flexible assembly has a complicated structure and a high cost.

Disadvantage (2)

The sine wave outputted allow a disc group edge distance of not less than 4 cm, and preferably 5 cm, which causes a result that the number of the magnetic sheet groups are too few and that the man-machine cooperation is not satisfying. If each group of magnetic sheets is identical, the output of the Hall element is sine waves for serving as the control signal. The sine waves serving as the control signal must have a peak-valley difference value. Since the magnetic sheet group in the application needs a certain length for representing the forward and reverse movement. The circular path of the annular-groove rotating disk with a diameter of 20 cm has at most 8 magnetic sheet groups provided thereon, and preferably 5, in such a manner that the Hall element is capable of generating sine wave signals having control function. In other words, when the technical solution of the patent application of 01201843.0 is utilized in a power assistance bicycle, the number of the magnetic sheet groups is limited to 8, the number of the control signal is too few and the man-machine cooperation is not satisfying. However, if the magnetic sheet groups are more than 8, the signal graph outputted by the Hall element is close to a horizontal line when a man rides on the bicycle in a fast speed. The signal does not have a control function and is not capable of controlling the motor, so that when the assistance power is particularly required, the power assistance function is lost.

Disadvantage (3)

The blind zone of the signal has a blind angle of 45 degrees, and the assistance power can not be obtained when required in starting. It is well known that the torque is minimal when a man steps on the pedal vertex of a bicycle. An area 10-45 degrees away from the vertex is the area requiring the assistance power most. However, in the patent application, the included angle among each magnetic sheet group is 45 degrees. The area 10-45 degrees away from the vertex of the pedal has no magnetic sheet group, i.e., no control signal. And the result is that the motor of the power assistance bicycle is not capable of providing assistance power while requiring the assistance power most.

In summary, except that the flexible assembly is not durable and has complicated structures, the diameter of the wheel is within 20 cm, which limits the number of the magnetic sheet group to 8. Thus, the groups of the magnetic sheets can not be added optionally, the man-machine cooperation is not satisfying, the assistance power is not available while starting. The assistance power can not meet the requirements. The cyclist is not comfortable while riding. If the number of the magnetic sheet groups is added forcibly, the sensing signals thereof loose the assistance power control function.

A Chinese patent application sensor for time-like electric power bicycle having a publication number of 03264387.X by Naikang Wang discloses a sensor without a flexible assembly. The sensor comprises a rotating disc and a stationary disc. Two permanent magnets are inset in the rotating disc. Three Hall elements are inset in the stationary disc. When the pedal of the bicycle rotates one cycle, each Hall element generates two pulses, and thus three Hall elements generate six pulses. Three features and four disadvantages of the patent application by Naikang Wang are analyzed as follows.

Feature (1)

In order to obtain six pulse signals, the same magnetic poles of the two permanent magnets are provided on a same side of the rotating disc, i.e., the two poles N or the two poles S of the two permanent magnets are on a certain side of the rotating disc. If a pole N of one permanent magnet and a pole S of another permanent magnet are on a same side of the rotating disc, each Hall element is only capable of generating one pulse by rotating the pedal one circle, and the three Hall element is only capable of generating three pulses, which is not in accordance with the disclosure of the specification of the patent application. In order to increase the pulses and the control effect, the same magnet poles of each permanent magnet can only be on an identical side.

Feature (2)

The permanent magnets are for presenting stationary positions of the pedal. The three Hall elements are for presenting motion positions of the pedal. Since the pedal and the rotating disk rotate synchronously, one permanent magnet is respectively provided on two positions of the rotating disc corresponding to the two pedals. The rotating position of a pedal is the rotating position of a corresponding permanent magnet. However, only when the rotating at the position of the Hall element, can the Hall element send a control signal, by which to instruct the power assistance bicycle to generate the assistance power to rotate.

Feature (3)

Since one Hall element is not capable of representing the motion positions in one rotating circle of the pedal at different times, utilizing only one Hall element is not desirable. The pedal has a great different requirement for the assistance power at different times of the rotating circle. In order to represent the variations of requirements for the assistance power, three Hall elements are respectively provided on three positions within 180 degrees in the patent application. Two permanent magnets are respectively provided on the positions of the pedal. The pedal rotates in a position of the Hall element, and the Hall element outputs signals for representing that the pedal reaches the position of the Hall element. However, utilizing multiple Hall elements has disadvantages as follows.

The features of the sensor of the power assistance bicycle have three disadvantages as follows.

Disadvantage (1)

Two identical permanent magnets respectively represent stationary positions of the two pedals. Multiple Hall elements are utilized for representing the rotating position of the pedals. The two identical permanent magnets have advantages that the stationary positions of the two pedals can be represented respectively with no differences between the left foot and the right foot. The left foot and the right foot have requirements for the assistance power and are capable of generating the same assistance effects to the motors. The disadvantage is that the permanent magnet itself is not capable of representing the rotating position of the pedal, and the rotating position of the pedal can only be represented by the positions of the multiple Hall elements provided on different corner positions. Thus, utilizing only one Hall element is infeasible, and multiple Hall elements must be utilized.

Disadvantage (2)

As utilizing one Hall element is infeasible, utilizing three Hall elements inevitably leads to original segment errors of three control signals, which causes distortion of the required power assistance model, so that the output of the assistance power is not in accordance with the requirements of the assistance power. No matter the power assistance bicycle has one motor or two motors, the motor signals controlled thereby can only achieve the object of controlling the motor by only one controller of sensing signal inputting motor. However, in the patent application, three Hall elements are utilized for controlling the motor, so only when the three control signals of the three Hall elements are combined into an integrated control signal, the control signal can be inputted to the motor controller. Sensor parameters of the three Hall elements can't be the identical. Particularly, due to variations of the environment temperatures, the sensor parameters of the three Hall elements may have great differences, which cause a result that different Hall elements output different voltages under the same power assistance requirements. Thus, the motor generates different outputs of assistance power, and the output of the assistance power id not in accordance with the requirements for the assistance power. Similarly, when identical assistance power is required, different Hall elements may output an identical voltage, so that the motor generates only one identical assistance power to output, which also brings the problem of inconformity between the outputs and the requirements of the assistance power.

Disadvantage (3)

The integrated control signal is easy to generate a signal drift, so that the integrated control signal does not match with the motor controller and that the power assistance model is distorted. Due to variations of the environment temperatures, the sensor parameters of the three Hall elements may have great differences after utilizing for a long time, which certainly leads to variations of three control signals of the three Hall elements, so that the integrated control signal generated by an identical power assistance requirement generates a segment signal drift. Thus the integrated control signal as a whole generates the segment signal drift, i.e. the assistance power model is distorted, which causes a result that no matter the motor controller selects any one of the three control signal for serving as a reference, the problems of inconformity between the requirements and the outputs of the assistance power.

Disadvantage (4)

Sensing sites can not be added randomly. The number of the sensing sites is too few, so that the operation of the motor is unstable and the rider feels uncomfortable. Since the disadvantages (1) and (2) are caused by the fact that the number of the Hall elements is over one, the more is the number of the Hall element, the more serious is the disadvantages (1) and (2). Thus, the power assistance bicycle provided by the patent application is a power assistance bicycle that makes the rider feels uncomfortable.

Disadvantage (5)

The bind zone of the signal has a blind angle reaching 42 degrees. The assistance power is not available when required. It is well known that The blind zone of the signal has a blind angle of 45 degrees, and the assistance power can not be obtained when required in starting. It is well known that the torque is minimal when a man steps on the pedal vertex of a bicycle. An area 10-45 degrees away from the vertex is the area requiring the assistance power most. However, in the patent application, the included angle among each magnetic sheet group is 42.5-43.5 degrees. The area 10-42 degrees away from the vertex of the pedal has no Hall elements, i.e., no control signal. And the result is that the motor of the power assistance bicycle is not capable of providing assistance power while requiring the assistance power most.

In summary, the patent application adopts a technical solution of controlling the power assistance model by multiple Hall elements. Since the rotating positions of the pedal can only be presented by multiple Hall elements, the multiple Hall elements controlled signals must have original errors; and the integrated control signal is easy to generate signal drift. Both of the situations cause distortion of the assistance power required model, i.e., the identical power assistance requirements at different times obtains different power assistance effects. The more is the number of the Hall elements, the more serious is the distortion degree of the power assistance required model, which limits the number of the Hall elements. The few amounts of the Hall elements cause a result that the operation of the motor is not steady, the rider feels uncomfortable, and that the assistance power is not available when starting. Thus, the patent application by Naikang Wang always attends to one thing and loses sight of another between the distortionless of the power assistance requirement model and the steady operation of the motor, and it is not possible to have both ways.

SUMMARY OF THE PRESENT INVENTION

An object of the present invention is to provide a power assistance bicycle having a sensor which is capable of obtaining the signals of the speed of a bicycle pedal and digitizing the signals into an assistance model signal only by a Hall element and rotations between the permanent magnetic blocks on the annular-groove rotating disk; and within the Hall element inductive region, is capable of increasing the number of permanent magnetic blocks as many as possible, maximizing the use of displacement information of the bicycle pedal, wherein in the sensor of the power assistance bicycle, the Hall element and a plurality of permanent magnetic blocks are fixed by an assembly. When the power assistance bicycle of the present invention is used, the power assistance demand of the rider and the power assistance provided match well, and the motor thereof stably operates.

The conception of the present invention is: within the Hall element inductive range, the pole N and the pole S are alternated on one surface of an annular-groove rotating disk where a plurality of identical permanent magnetic blocks face the Hall element, in such a manner that alternation of the pole N and the pole S of the permanent magnetic blocks allows the Hall element to generate rectangular waves for acquiring signals with much stronger control function and more quantity. There is more information representing the moving state of the pedal of the power assistance bicycle.

The relative position of the Hall sensing element and the multiple permanent magnetic blocks is fixed by the assembly of a mechanical structure for acquiring stable and reliable sensing signals of the Hall element.

The rectangular wave signals outputted by the Hall element are converted to digital signals, which is convenient for digitizing the digital signals of the Hall element, a power assistance mathematical model capable of allowing the coordination of the person and the machine may be added during the digitalization, the power assistance mathematical model is able to be randomly adjusted according to the people machine coordination. Therefore, the present invention is capable of overcoming the problem that sine wave signals outputted by a Hall element in the prior art are not easy to be digitized, but simulated and the randomly adjustable power assistance model can not be added; the problem that only the power assistance model limited by speed signals is extracted; and the problem that the people is not able to best coordinated with the machine.

The annular-groove rotating disk is sleeved outside the annular-groove fixing disk to form a chimeric rotation connection. The annular-groove rotating disk has a common rotation center with a medial shaft, in such a manner that the annular-groove rotating disk and the pedal rotate synchronously, and that a plurality of the permanent magnetic blocks on the annular-groove rotating disk and the pedal rotate synchronously, so that the Hall element is capable of collecting motion states of the pedal, and thus the sensor is capable of sensing requirements for power assistance while riding the bicycle.

The structure of the present invention is described as follows.

A power-assistance bicycle using a sensor having multiple magnet blocks evenly distributed in a housing comprises: an electric bicycle and a sensor;
wherein the electric bicycle has a medial shaft 51, a casing 52 is sleeved on a middle section of the medial shaft 51, the medial shaft 51 is rotationally connected with the casing 52; a chain wheel 53 is fixed on the medial shaft 51, and two pedals 54 are respectively fixed on two ends of the medial shaft 51; a battery 55 is connected with a motor controller 29, and the motor controller 29 is connected with a motor 30 on a wheel of the power-assistance bicycle;

wherein a structure of the sensor and connections of elements thereof are:
the sensor comprising a sensing element, a power assistance model processor 21, a digital-to-analog converter 27 and an operational amplifier 28 connected in sequence, wherein [1] the sensing element is adapted for transforming rotational motions of an annular-groove rotating disk 1 to rectangular wave output signals;

wherein the sensing element comprises the annular-groove rotating disk 1, an annular-groove fixing disk 40, a Hall element 3 and a plurality of permanent magnetic blocks 2 which have identical sizes, identical shapes and identical magnetic flux; a concave of the annular-groove rotating disk 1 is opposite to that of the annular-groove fixing disk 40, and the annular-groove fixing disk 40 is inserted into an annular groove of the annular-groove rotating disk 1 to form a fitting interior-empty housing in which two disks are capable of relatively rotating with each other, the concave of the annular-groove rotating disk 1 and that of the annular-groove fixing disk 40 form a hollow ring 41; the plurality of permanent magnetic blocks 2 are fixedly arranged on a portion of the annular-groove rotating disk 1 within the hollow ring 41, and the plurality of permanent magnetic blocks 2 are distributed along a circular trajectory; that is to say, that distances of all permanent magnetic blocks 2 to a center of the circular trajectory 5 are identical; lengths of two adjacent permanent magnetic block intervals are identical; pole N and pole S of each permanent magnetic block 2 are respectively provided on two surfaces of the annular-groove rotating disk 1, magnetic polarities of every two adjacent permanent magnetic blocks 2 are opposite, the magnetic polarities of all permanent magnetic blocks 2 on the annular-groove rotating disk 1 are distributed in a pattern of pole N, pole S, pole N, pole S, pole N, pole S . . . ;

the Hall element 3 is fixedly located on a portion of the annular-groove fixing disk 40 within the hollow ring 41, and is located at a position which is close to the permanent magnetic blocks 2 and capable of inducting the magnetic flux of each of the permanent magnetic blocks 2, a distance is provided between the Hall element 3 and the permanent magnetic blocks 2; the Hall element 3 is adapted for generating the rectangular wave output signals aiming at two opposite magnetic polarities;

[2] the power assistance model processor 21 is a signal form converter adapted for converting rotating digital signals of the annular-groove rotating disk 1 to power assistance model digital signals;

wherein the power assistance model processor 21 comprises an analog-digital conversion and rate calculator 24, a power assistance model storage 25 and a power assistance model calculator 26;

the analog-to-digital conversion and rate calculator 24 is connected with the Hall element 3, the analog-to-digital conversion and rate calculator 24 calculates rectangular wave signals inputted by the Hall element 3 to obtain rates of change for representing a rotating speed of the annular-groove rotating disk 1;

the analog-to-digital conversion and rate calculator 24 is connected with the power assistance model calculator 26, and the power assistance model storage 25 is also connected with the power assistance model calculator 26, the power assistance model calculator 26 selects a certain power assistance model function of the power assistance model storage 25 via the rotation rate of the annular-groove rotating disk 1 of the analog-to-digital conversion and rate calculator 24 and the rotation rate of the annular-groove rotating disk 1 calculated by the analog-to-digital conversion and rate calculator 24 of the annular-groove rotating disk 1 is inputted into the power assistance model function to calculate a suitable power assistance model digital signal, that is to say, that the power assistance model calculator 26 outputs the power assistance model digital signals;

[3] the digital-to-analog converter 27 is adapted for converting the power assistance model digital signals to power assistance model analog signals;

wherein the power assistance model calculator 26 is connected with the digital-to-analog converter 27, and the digital-to-analog converter 27 converts the power assistance model digital signals of the power assistance model calculator 26 to the power assistance model analog signals;

[4] the operational amplifier 28 is adapted for converting the power assistance model analog signals of the digital-to-analog converter 27 to power assistance model analog signals within a rated voltage range.

Connections of the sensor and the power-assistance bicycle are as follows.

The annular-groove rotating disk 1 and the annular-groove fixing disk 40 are respectively sleeved outside a medial shaft 51 of the electric bicycle. The annular-groove fixing disk 40 is fixedly mounted on the casing 52 of the medial shaft 51. The annular-groove rotating disk 1 of the sensor is mounted on the medial shaft 51 of the electric bicycle. The annular-groove rotating disk 1 rotates synchronously with the medial shaft 51. The annular-groove rotating disk 1 is sleeved outside the annular-groove fixing disk 40 to form an inserted rotation connection. The annular-groove rotating disk 1 and the medial shaft 51 have a common rotation center. A signal output wire of the operational amplifier 28 is connected with a signal input end of the motor controller 29 of the electric bicycle.

Working principles of the sensor are illustrated as follows. The working principles of the sensors are classified into signals obtaining and signals processing, so as to facilitate the illustration of the structural relationships and functions of each part of the sensor. The function of obtaining signals is carried out by the annular-groove rotating disk 1, the annular-groove fixing disk 40, the permanent magnetic blocks 2 and the Hall element 3 which are appropriately provided; and the function of processing signals is carried out by the power assistance model processor 21, the digital-to-analog converter 27 and the operational amplifier 28 which process the signals output by the Hall element 3 into power assistance model analog signals that the motor controller 29 of the electric bicycle are capable of utilizing.

[I] Description of the Sensing Element:

The annular-groove rotating disk 1 is not only engaged with the annular-groove fixing disk 40, but also capable of relatively rotating with each other, which ensures when the annular-groove rotating disk 1 rotates, induction positions of the Hall element 3 relative to all of the permanent magnetic blocks 2 are not changed, such that output signals of the Hall element 3 are only related to a rotation of all of the permanent magnetic blocks 2, and not related to the annular-groove rotating disk 1 and the annular-groove fixing disk 40; if the annular-groove rotating disk 1 and the annular-groove fixing disk 40 are made of metal, a shielding effect will be produced, so that the Hall element 3 and all of the permanent magnetic blocks 2 are located within the hollow ring 41 via the annular-groove rotating disk 1 and the annular-groove fixing disk 40 for inducting, which improves the signal reliability and authenticity of the Hall element 3.

When the annular-groove fixing disk 40 is fixed to a certain object, the annular-groove rotating disk 1 is rotated, and each of the permanent magnetic blocks 2 on the annular-groove rotating disk 1 sweeps the Hall element 3 on the annular-groove fixing disk 4, the Hall element 3 is capable of generating an electrical signal via each of the permanent magnetic blocks 2. The magnetic polarities of two adjacent permanent magnetic blocks 2 are opposite, that is to say, that the magnetic polarities of all of the permanent magnetic blocks 2 face to the Hall element 3 in a pattern of south-north alternation, so that the Hall element 3 generates the rectangular wave signals which are convenient for digitalization to achieve the digital control. In the prior art, the magnetic polarities of all of the permanent magnetic blocks 2 facing to the Hall element 3 are same, so that the Hall element 3 only generates sine wave signals for analog control; once inductive parameters of the Hall element 3 change, the analog control may be distorted. However, the present invention adopts the rectangular wave signals to digitally control, so that the digital distortion is not generated.

The annular-groove rotating disk 1 can be a not-easily deformed material plate made of plastic, high-strength insulation material, copper and aluminum. While using the sensing element, the annular-groove rotating disk 1 needs to be rotated; a rotation center is a center of a circle at which an annular distribution, formed by the permanent magnetic blocks 2, is provided.

An object of the annular distribution of the permanent magnetic blocks 2 within the ring is to only adopt one Hall element 3 to induct the moving states of all of the permanent magnetic blocks 2 on the annular-groove rotating disk, that is to say, to induct moving velocities of all permanent magnetic blocks 2 on the annular-groove rotating disk and speed variations thereof, namely, or called accelerations, the moving states of all of the permanent magnetic blocks 2 are expressed via a continuously electrical signal generated by the Hall element 3. And because all of the permanent magnetic blocks 2 are respectively fixed on the annular-groove rotating disk 1, the continuously electrical signal generated by the Hall element 3 is capable of express a moving state of the annular-groove rotating disk. If the continuously electrical signal is used to control other objects, the continuously electrical signal is a control signal. If a motor for controlling a power assistance bicycle also needs a SCM (Single Chip Microcomputer) or other electronic components as a signal processor, the essential factor comprising the velocity and acceleration in the control signal is converted to the power assistance signals which represent how much power assistance is needed, a conversion function is a power assistance demand model, or called a power assistance model.

The Hall element 3 is located at a position which is close to the permanent magnetic blocks 2 and capable of inducting the magnetic fluxes of the permanent magnetic blocks 2 to induct the moving states of the permanent magnetic blocks 2 via the Hall element 3, so as to induct the moving states of the annular-groove rotating disk, namely, the moving velocities and accelerations.

It is very important for every two adjacent permanent magnetic blocks 2 to have opposite magnetic polarities, the magnetic polarities of all of the permanent magnetic blocks 2 are distributed in a pattern of pole N, pole S, pole N, pole S, pole N, pole S . . . to output the rectangular wave signals with spaced high and low levels via the Hall element 3. When the annular-groove rotating disk with limited size is rotated for a circle, the accurately variable signals are needed to be acquired as many as possible, so that the rectangular wave is selected. The variable time of the peak-valley value of the rectangular wave signal is short, so the signals adapted for controlling as many as possible are generated within a certain time. The structure that every two adjacent permanent magnetic blocks 2 having opposite magnetic polarities produces the rectangular waves, and however, the structure that every two adjacent permanent magnetic blocks 2 having same magnetic polarities produces the sine waves, especially for the power assistance bicycle, a diameter of the annular-groove rotating disk as the sensing element is generally limited to 10-15 cm, when the signals adapted for controlling are acquired under the condition of the limited diameter, rotating a circle, the pulses capable of being provided of producing the rectangular waves is 7 to 9 times the number of producing the sine waves. Naturally, the structure that every two adjacent permanent magnetic blocks 2 having opposite magnetic polarities has a better control effect on the power assistance bicycle, the rider is capable of better coordinating with the bicycle, and the rider feels more comfortable while riding the bicycle.

[II] The description of the power assistance model processor 21: the power assistance model processor 21 is a signal form converter adapted for converting the rotating digital signals of the annular-groove rotating disk 1 to the power assistance model digital signals;

wherein the power assistance model processor 21 comprises an analog-digital conversion and rate calculator 24, a power assistance model storage 25 and a power assistance model calculator 26;

wherein the power assistance model processor 21 converts the rectangular waves signals of the Hall element 3 in the sensing element into digital signals representing rotation velocity of the annular-groove rotating disk 1 via the analog-digital conversion and rate calculator 24; then a power-assisted mathematical model suitable for a certain rotation speed is selected from the power assistance model storage 25 via the digital signals representing the rotation velocity; and then the the digital signals representing the rotation velocity is plugged into the power-assisted model calculator 26 for figuring out power-assisted model digital signals suitable for the speed. That is to say the power-assisted model calculator 26 is capable of outputting the power-assisted model digital signals.

[III] The description of the digital-to-analog converter 27: the digital-to-analog converter 27 is adapted for converting the power assistance model digital signals to the power assistance model analog signals.

The power assistance model calculator 26 is connected with the digital-to-analog converter 27, and the digital-to-analog converter 27 converts the power assistance model digital signals of the power assistance model calculator 26 to the power assistance model analog signals for outputting the power assistance model analog signals to a motor controller 29 which is only capable of processing the analog signals.

[IV] The description of the operational amplifier 28: the operational amplifier 28 is adapted for converting the power assistance model analog signals of the digital-to-analog converter 27 to the power assistance model analog signals within the rated voltage range.

The digital-to-analog converter 27 is connected with the operational amplifier 28, the power assistance model analog signals of the digital-to-analog converter 27 resolve the power assistance model problem, but the voltage of the power assistance model signal still can not meet the demand of the motor controller 29. Therefore, the power assistance model analog signals are converted to the power assistance model analog signals needed by the rated voltage range via the operational amplifier 28, and then are transmitted to the motor controller 29.

Descriptions of connections of the sensor and the electric bicycle to form the power-assistance bicycle are as follows.

In order to illustrate a practical installation, the sensor practically comprises a mechanical part and a sensing part, so as to describe structure relationship of each part of the sensor and each part of the electric bicycle. The mechanical part comprises the annular-groove rotating disk 1 and the annular-groove fixing disk 40 which are clamped and sleeved to be a rotatably connected to form a housing having an annular space. The sensing part is provided in the annular space of the housing, and a plurality of permanent magnetic blocks are fixed in an inner surface of the annular-groove rotating disk 1 in the annular space of the housing. The permanent magnetic blocks 2 rotates synchronously with the annular-groove rotating disk 1, so as to drive the plurality of permanent magnetic blocks 2 and the pedals 54 to rotate synchronously, in such a manner that an object of representing mechanical motions of a rider requiring for power assistance by the plurality of permanent magnetic blocks. The Hall element 3, the power assistance model processor 21, the digital-to-analog converter 27 and the operational amplifier 28 are fixed on an inner surface of the annular-groove fixing disk 40 in the annular space of the housing. The annular-groove fixing disk 40 is fixedly connected with the casing 52 of a frame of the bicycle, in such a manner that the annular-groove fixing disk 40 is not capable of rotating with the annular-groove rotating disk 1, and the Hall element 3, the power assistance model processor 21, the digital-to-analog converter 27 and the operational amplifier 28 are not capable of rotating with the annular-groove rotating disk 1, so that the Hall element 3 is capable of sensing rotating positions of all the permanent magnetic blocks by utilizing only one fixed position, in such a manner that mechanical motions requiring for assistance power by the rider are converted to electric signals. Then the electric signals requiring for power assistance of the Hall element 3 is converted to man-machine matching power-assisted model electric signals. The operational amplifier 28 transmits the man-machine matching power-assisted model electric signals to the motor controller 29. The motor controller 29 controls the motor 30 to rotate according to the man-machine matching manner, and finally the power-assistance bicycle moves according to requirements of the human, i.e., the man-machine matching effects are achieved finally.

According to the present invention, signals outputted by the signal processing elements are:

the Hall element 3 outputs rectangular wave signals;

the power assistance model processor 21 outputs power assistance model digital signals;

the analog-digital conversion and rate calculator 24 converts the rectangular waves signals to digital signals, calculates and outputs rotation rate digital signals of the annular-groove rotating disk 1;

the power assistance model storage 25 stores a plurality of power assistance model functions for alternating, and outputs digital signals of the selected power assistance model function);

the power assistance model calculator 26 calculates and outputs power assistance model digital signals for controlling functions;

the digital-to-analog converter 27 outputs power assistance model analog signals converted from the power assistance model digital signals;

the operational amplifier 28 outputs power assistance model analog signals within a rated voltage range converted from the power assistance model analog signals; and a thermal resistor R6 ensures that the operational amplifier 28 outputs the power assistance model analog signals within the rated voltage range, namely standard power assistance model analog signals.

For solving drift of the power assistance model analog signals, the thermal resistor R6 is provided. The thermal resistor R6 is connected between an input terminal and an output terminal of the operational amplifier 28.

The Hall element 3, the digital-to-analog converter 27 and the operational amplifier 28 are semiconductor devices with analog signal processing capability. Therefore, signals are easy to drift due to temperature changes, especially in summer and winter. Furthermore, the power assistance bicycle is utilized outdoor, and signal parameter drift due to temperature changes is significant. As a result, the signals outputted by the operational amplifier 28 should be drift-revised for obtaining the standard power assistance analog signals which are not affected by the temperature changes. The standard power assistance analog signals control the motor 30 through the motor controller 29, in such a manner that a rider feels no difference between power assistance effects in summer and winter.

The power assistance model processor 21 is a single chip microcomputer 31, and a clock circuit 32 is connected to the single chip microcomputer 31. The single chip microcomputer 31 completes functions of the analog-to-digital converting the analog-digital conversion and rate calculator 24, the power assistance model storage 25, and the power assistance model calculator 26. Clock signals of the clock circuit 32 are for distinguishing the rectangular wave signals inputted from the Hall element 3, preferably, a length of each clock signal is 0.001 s.

A structure of mechanical parts and sensing parts of the sensor is: the mechanical parts of the sensor are the annular-groove rotating disk 1 and the annular-groove fixing disk 40 engaged with each other; the sensing parts of the sensor are a plurality of permanent magnetic blocks 2, the Hall element 3, the single chip microcomputer 31, the digital-to-analog converter 27, and the operational amplifier 28; wherein among the sensing parts, the Hall element 3, the single chip microcomputer 31, the digital-to-analog converter 27, and the operational amplifier 28, which are connected in sequence, are provided on a circuit board 59; a plurality of permanent magnetic blocks 2 are provided on an internal wall of the annular-groove rotating disk 1 of the hollow ring 41, and the circuit board 59 is mounted on an internal wall of the annular-groove fixing disk 40 of the hollow ring 41; the Hall element 3 on the circuit board 59 is provided at a position where the Hall element 3 senses magnetic fluxes of the permanent magnetic blocks 2 and outputs electrical signals according to magnetic flux changes. The sensing parts are sensing functional parts of the sensor. The mechanical parts have two functions: firstly, keeping relative positions of the elements of the sensing parts for forming a sensing functional integral with the elements; secondly, mounting the sensing functional integral on an electric bicycle and enabling the sensing functional integral to sense a moving state of the electric bicycle. Providing the Hall elements 3, the single chip microcomputer 31, the digital-to-analog converter 27, and the operational amplifier 28, which are connected in sequence, on the circuit board 59 is conducive to integration, modularization and miniaturization thereof, as well as mounting the four elements on the internal wall of the annular-groove fixing disk 40 of the hollow ring 41 as a whole, for simplifying manufacturing of the sensor.

According to the present invention, preferred models and connection of each part of the sensor are: the Hall element 3 is UGN3075, the power assistance model processor 21 is the AT89S52 single chip microcomputer 31, the digital-to-analog converter 27 is ADC-C8E, the operational amplifier 28 is OF-17F, the thermal resistor R6 is connected between an input pin D2 and an output pin D6 of the OF-17F operational amplifier 28; wherein the connection relationship thereof are as follows:

an output pin F3 of the Hall element 3 is connected to a pin INTO [P32], of the single chip microcomputer 31;

a pin P00, of the single chip microcomputer 31 is connected to a pin B8, of the digital-to-analog converter 27;

a pin P01, of the single chip microcomputer 31 is connected to a pin B7, of the digital-to-analog converter 27;

a pin P02, of the single chip microcomputer 31 is connected to a pin B6, of the digital-to-analog converter 27;

a pin P03, of the single chip microcomputer 31 is connected to a pin B5, of the digital-to-analog converter 27;

a pin P04, of the single chip microcomputer 31 is connected to a pin B4, of the digital-to-analog converter 27;

a pin P05, of the single chip microcomputer 31 is connected to a pin B3, of the digital-to-analog converter 27;

a pin P06, of the single chip microcomputer 31 is connected to a pin B2, of the digital-to-analog converter 27;

a pin P07, of the single chip microcomputer 31 is connected to a pin B1, of the digital-to-analog converter 27;

a pin D4 of the digital-to-analog converter 27 is connected to the pin D2 of the operational amplifier 28;

a pin H2 of the digital-to-analog converter 27 is connected to a pin H3 of the operational amplifier 28; and the pin D6 of the operational amplifier 28 is an analog signal output terminal.

The thermal resistor R6 is connected between the input pin D2 and the output pin D6 of the OF-17F operational amplifier 28, and a capacitor C6 is connected to two ends of the thermal resistor R6 in parallel. Preferably, a resistance of the thermal resistor R6 is 5K, a capacitance of the capacitor C6 is 8 P, and a resistor R5 with a resistance of 1.25 k is connected between the pin D4 of the digital-to-analog converter 27 and the pin D2 of the operational amplifier 28 for grounding, in such a manner that a voltage range of the analog signals outputted by the pin D6 of the operational amplifier 28 is capable of being adjusted by the thermal resistor R6 to 0.8~4.2V.

A bearing 42 is provided between an external surface of an internal ring of the annular-groove fixing disk 40 and an internal surface of an internal ring of the annular-groove rotating disk 1. The bearing 42 keeps a sufficient relative rotation between the annular-groove fixing disk 40 and the annular-groove rotating disk 1 for a long time.

A circular depression 58 is provided on an outer surface of the annular-groove fixing disk 40 of the sensor; the circular depression 58 clamps on the casing 52 outside the medial shaft 51 of the electric bicycle, in such a manner that the casing 52 is clamped and fixedly connected in the circular depression 58. The connection of clamping the circular depression 58 of the annular-groove fixing disk 40 with the casing 52 outside the medial shaft 51 of the electric bicycle has beneficial effects of simple installation, easy cleaning and beautiful appearance.

The Hall element 3 is provided on the circular trajectory 5 opposite to the plurality of the permanent magnetic blocks 2, because the Hall element 3 is able to sense the magnetic flux of the permanent magnetic block 2 and output the electrical signals with an interval. Furthermore, for decreasing a volume of the permanent magnetic block 2 as much as possible, providing the permanent magnetic blocks 2 on the annular-groove rotating disk 1 as many as possible, and sensing all the permanent magnetic blocks 2 by the Hall element 3, the Hall element 3 is provided opposite to the circular trajectory 5, and preferably at a position which crosses all circular trajectories of the permanent magnetic blocks 2.

A center hole is provided at a center of a circular range of the circular trajectory 5 of the permanent magnetic block 2 on the annular-groove rotating disk 1. If the annular-groove rotating disk 1 is coated on a rotation shaft for being utilized, a coating hole for the rotation shaft should be provided on the annular-groove rotating disk 1. For enabling the Hall element 3 to sense the moving signals of all the permanent magnetic blocks 2 on the annular-groove rotating disk 1 when the annular-groove rotating disk 1 rotates with the rotation shaft, the coating hole should be provided at the center of the circular range of the circular trajectory 5 of the permanent magnetic block 2 on the annular-groove rotating disk 1 called a center hole. However, the center hole does not have to be circular, the center hole may be square, triangle, etc., so as to cooperate with a square, triangle or other shape rotation shaft, but a hollow area of the center hole must comprises a circle center of the circular trajectory 5, in such a manner that the Hall element 3 is able to sense the moving signals of all the permanent magnetic blocks 3 on the annular-groove rotating disk 1.

The annular-groove rotating disk 1 is made of a non-magnetic plastic, aluminum or copper board. According to the present invention, the adjacent permanent magnetic blocks 2 have opposite magnetic polarity structures, which enables the Hall element 3 to output the electrical signals with a controlling function even if edges of the adjacent permanent magnetic blocks 2 are almost contacted with each other.

Advantages of the present invention are: a simple structure, a low cost, no quantity limit for the permanent magnetic blocks on a permanent magnetic block ring, outputting standard pulse signals, no signal blind area, fully representing all moving stats of a moving disk only by one Hall element and a set of output signals, no distortion and drift of the output signals, being adaptable for power assistance bicycle, and comforting a rider by highly cooperating power assistance output with power assistance requirements.

(1) the simple structure, no elastic member, no mechanical failure: the Hall element senses the rotating output signals of a plurality of permanent magnetic blocks; with a speed-to-moment principle provided by a Chinese patent 01201843.0, moment parameters of the power assistance bicycle are able to be calculated by a variety of mathematical models, so as to control the motor of the power assistance bicycle for power assistance; no elastic part is utilized, the structure is simple, and the cost of the present invention is lower than that of sensors using the elastic parts and mechanical force bearing; deformation of each mechanical part after long-term use is avoided, no mechanical failure and cooperating problem exist.

(2) the opposite magnetic polarities, outputting the rectangular wave signals, and the precise controlling function: because the adjacent two permanent magnetic blocks have opposite magnetic polarities and the Hall element generating rectangular wave output signals according to the opposite polarities is utilized, no matter how narrow an interval is between the two adjacent permanent magnetic blocks, even if there is no gap, the Hall element is also able to output rectangular wave signals; if the sensor is utilized on the power assistance bicycle, the rectangular wave output signals are better than sine waves for controlling the power assistance bicycle, because by utilizing rectangular waves, signals representing moving speeds are precise at any point and any time, so as to precisely represent moving speed of pedals of the power assistance bicycle, for calculating correct power assistance requirements for the moving state by a precise speed of the pedals.

(3) the opposite magnetic polarities of the adjacent permanent magnetic blocks, no quantity limit for the permanent magnetic blocks, and increase sensing points as many as possible: because of the opposite magnetic polarities and the rectangular wave output signals, even if there is no gap between the adjacent permanent magnetic blocks, the output signals are still a plurality of distinguishable rectangular wave signals with the controlling function; that is to say, linear signals with no controlling function and no change will not be outputted; if the sensor is utilized on the power assistance bicycle, a size of the annular-groove rotating disk linked with the pedals is limited, and the permanent magnetic blocks and the sensing points are arranged as many as possible, in such a manner that the moving speeds of the pedals are represented by as many sensing signals as possible for precise representation of the moving state.

(4) the opposite magnetic polarities of the adjacent permanent magnetic blocks, a large number of the permanent magnetic blocks and the sensing points, and the precise representation of the moving state of the annular-groove rotating disk: the size of the annular-groove rotating disk adapting to the power assistance bicycle for fixing the permanent magnetic blocks is strictly limited; usually a diameter thereof is no more than 10~15 cm; for enabling the Hall elements to sense polarity signals of the permanent magnetic blocks with the intervals, a diameter of each of the permanent magnetic blocks is at least 0.6~0.8 cm, and 35~73 permanent magnetic blocks are able to be arranged without interval around the annular-groove rotating disk with the diameter of 10~15 cm, wherein [(10−1)*3.14/0.8=35; (15−1)*3.14/0.6=73]; that is to say, after the pedal rotates once, the Hall element is able to obtain 35-73 signals for controlling the motor of the power assistance bicycle; however, according to the conventional technology where magnetic polarities of adjacent permanent magnetic blocks are the same, the adjacent permanent magnetic blocks having a 5 cm-interval; as a result, only 5~8 permanent magnetic blocks are able to be arranged around the annular-groove rotating disk with a diameter of 10~15 cm, wherein [(10−1)*3.14/5.8=5; (15−1)*3.14/5.6=8]; therefore, the permanent magnetic blocks of the present invention are 7~9 times more than the permanent magnetic blocks of the conventional technology, wherein [35/5=6; 73/8=9]; which means 30~65 more permanent magnetic blocks are provided, wherein [35−5=30; 73−8=65]; therefore, after the annular-groove rotating disk rotates once, rotating point signals of the annular-groove rotating disk of the present invention is 7~9 times more than that of the conventional technology; as a result, motor control accuracy for a power assistance bicycle is naturally raised by 7~9 times and power assistance accuracy for the rider is also increased by 7~9 times, in such a manner that cooperation of the rider and the bicycle are greatly improved as well as rider comfort; uncomfortable feeling according to the conventional technology, which is sometimes fast and sometimes slow, no longer exists; according to actual experience of the applicant, when there are about 15 permanent magnetic blocks evenly provided on the annular-groove rotating disc, the feeling which is sometimes fast and sometimes slow due to 5~8 permanent magnetic blocks of the conventional technology is basically eliminated; when there are about 20 permanent magnetic blocks evenly provided on the annular-groove rotating disc, the cooperation of the bicycle and the rider is able to satisfy the rider and the power assistance bicycle comfortable to ride.

(5) no signal blind area, providing power assistance corresponding the power assistance requirements at any time: according to the present invention, at most 35~73 permanent magnetic blocks are able to be arranged around the annular-groove rotating disk with the diameter of 10~15 cm, and an average angle between the adjacent permanent magnetic blocks are 5~10 degrees; if the sensor is utilized on the power assistance bicycle, during starting or running, there are 4~7 permanent magnetic blocks in a 35-degree area determined by the pedal from 10 to 45 degrees away from an apex (at 10 degrees away from the apex there is a first signal), and the Hall element outputs 4~7 controlling signals representing the power assistance requirements for achieving a excellent technical effect that the power assistance is available at anywhere and anytime as long as there is the power assistance requirement, in such a manner that the cooperation of the bicycle and the rider is sufficient and rider feels comfortable.

(6) only one Hall element, one controlling signal representing all moving states of the annular-groove rotating disk, the controlling signal completely consistent with the moving state of annular-groove rotating disk, and the controlling signal completely consistent with rider requirements: a plurality of permanent magnetic blocks are mounted on the annular-groove rotating disk and synchronously rotate with the annular-groove rotating disk; by sensing the moving signals of all of the permanent magnetic blocks by one Hall element, the controlling signals outputted by the Hall element is completely consistent with the moving state of the annular-groove rotating disk as well as the rider requirements, and the controlling signals avoids initial segment errors and signal drift; Even if sensing parameters of the Hall element change, the controlling signals will move in parallel; as long as a receiving range of the motor receiving the Hall controlling signals is wide, a controlling effect of the changed controlling signals will systemically change, if the sensor is utilized on the power assistance bicycle, a power assistance requirement model will not be distorted, power assistance output and the power assistance requirements remain an original model matching relationship, wherein the rider can easily handle the systemic change of power assistance performance.

(7) a housing is formed by the relative-rotating annular-groove rotating disk and the annular-groove fixing disk, which fixes relative positions of the Hall element and all of the permanent magnetic blocks for avoiding external environment interference, improving reliability and authenticity of the Hall signals, and facilitating installation, commissioning as well as maintenance.

(8) digitization for the Hall signals, so as to transform digital signals into the power assistance model digital signals with rotating velocity of the rotating disk, then the power assistance model digital signals are transformed into the power assistance model analog signals, and finally the power assistance model analog signals are transformed into the controlling signals suitable for the motor controller with a stable voltage range and rated power; in short, the magnetic block rotation signals digitalized, and during the digitalization, the mathematical power assistance model is added, in such a manner that the power assistance model is comprised in the final controlling signals outputted by the sensor; because the mathematical power assistance model is artificial, the mathematical power assistance model is always able to be set to the preferred man-machine model, in such a manner that the sensor according to the present invention is able to output man-machine controlling signals; however, according to the conventional sensor for the power assistance bicycle, same polarities of different permanent magnetic blocks are at the same side; therefore, the Hall element cannot obtain the rectangular wave signals, and the Hall signal cannot be digitized, wherein a control model of the conventional sensor is only able to partly modify the Hall signals, which cannot output the man-machine controlling signals.

(9) no signal drift for the last controlling signals: the thermal resistor R6 provides feedback regulation for the output signals of the operational amplifier, which is able to the solve an analog signal drift problem of the power assistance model due to semiconductor devices such as the Hall element, the digital-to-analog converter and the operational amplifier, in such a manner that the sensor finally outputs the standard power assistance model analog signals which are not affected by the environment temperature changes.

The operation mode capable of achieving man-machine matching is as follows. The power assistance model calculator utilizes the power assistance mathematical model cooperated with the power assistance requirements in the power assistance model storage and parameter of velocity provided by the magnetic block rotation velocity calculator is substituted into the power assistance mathematical model, so the power assistance model calculator is capable of calculating power assistance model digital signals which are a control signals for controlling the motor and capable of matching the rider and the bicycle. The power assistance model calculator is a digital processor which is capable of reserving any digital mathematical model, so the power assistance model storage is capable of providing the power assistance model calculator with any artificial mathematical model. U Under the condition of randomly setting mathematical model, people can set a mathematical model matching the rider and the electric motor. Since the power assistance model storage has inartificially set and capable of matching the rider and the electric bicycle, the cooperated operation manner of the rider and the electric bicycle is achieved. The artificially set mathematical model can also make the motor have a satisfying starting and running model and a power conservation operation manner. Thus, the power-assistance bicycle of the present invention is a power conservation power-assistance bicycle cooperated by the rider and the electric bicycle.

(10) In one rotation period of the pedal of the conventional power-assistance bicycle, the Hall element is only capable of outputting less than 10 sinusoidal wave signals. The sinusoidal wave signals can not be transformed into digital signals and can not be added to the motor of the electric bicycle controlled by the power-assisted model. The power-assisted model of this kind of power assistance bicycle is not capable of achieving man-machine matching, and not capable of providing a satisfying and power conservation manner of working for the motor.

(11) Power conservation effects and significances are as follows. The power-assistance bicycle of the present invention is compared with power-assistance bicycle with a sensor having 8 permanent magnetic blocks on an identical surface as an identical magnetic pole which is purchased in the market. The method of changing different sensors on one electric bicycle is utilized, and a same rider rides the electric bicycle on an identical section of road for testing. The result is as follows. After riding the power-assistance bicycle of the present invention for 110 kilometers, the battery still has a small amount of power. After riding the power-assistance bicycle purchased on the market for 45 kilometers, the battery is power off. The significances of power conservation lies in that the fully charged power-assistance bicycle of the present invention is capable of being rided for a whole day without battery charging, which solves the great problems of the conventional power-assistance bicycle of not capable of providing power assistance on the way.

These and other objectives, features, and advantages of the present invention will become apparent from the following detailed description, the accompanying drawings, and the appended claims.

Element reference: 1—annular-groove rotating disk, 2—permanent magnetic block, 3—Hall element, 5 circular trajectory, 21—power assistance model processor, 24—analog-digital conversion and rate calculator; 25—power assistance model storage, 26—power assistance model calculator, 27—digital-to-analog converter, 28—operational amplifier, 29—motor controller, 30—motor, 31—single chip microcomputer, 32—clock circuit, 40—annular-groove fixing disk, 41—hollow ring, 42—bearing, 51—medial shaft; 52—casing; 53—chain wheel; 54—pedal; 55—battery; 58—circular depression; 59—circuit board.

DETAILED DESCRIPTION OF THE PREFERRED EMBODIMENT

Embodiment 1

Figure 1:
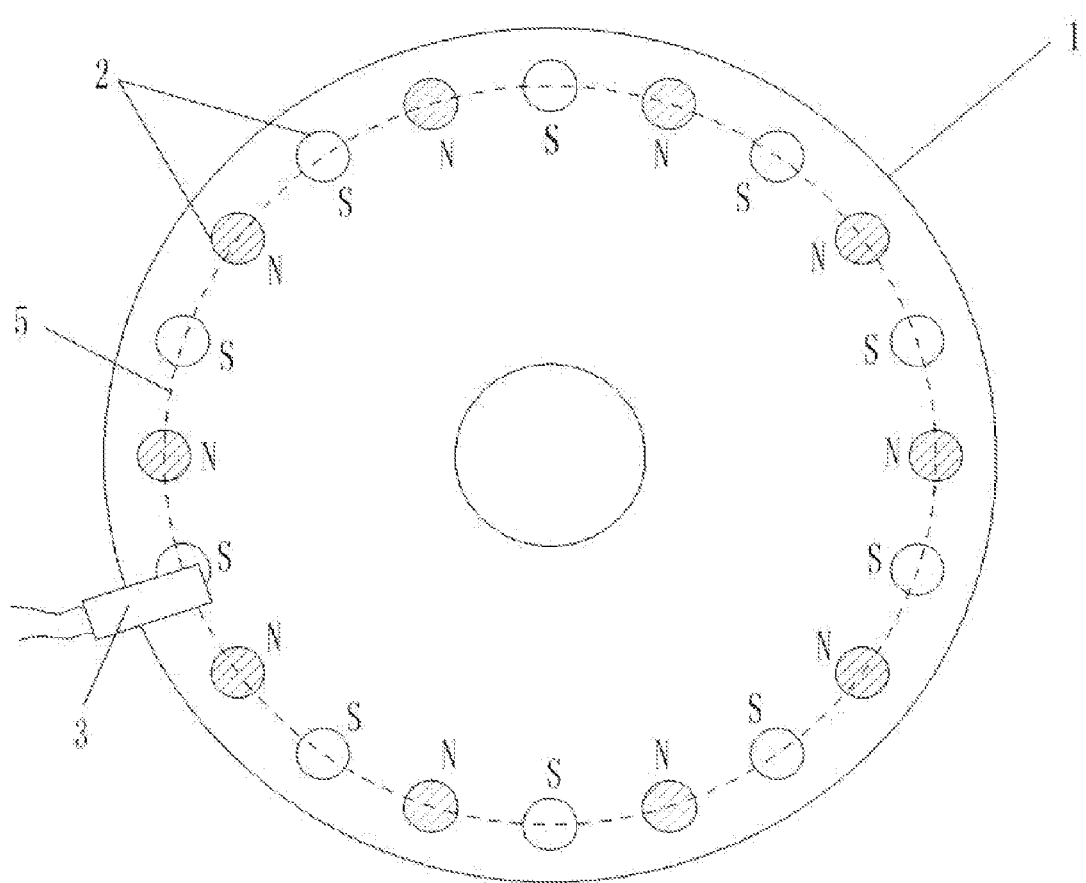
FIG. 1 is a sensing element sketch view of a plurality of N-S alternating permanent magnetic blocks on an annular-groove rotating disk.
Figure 3:
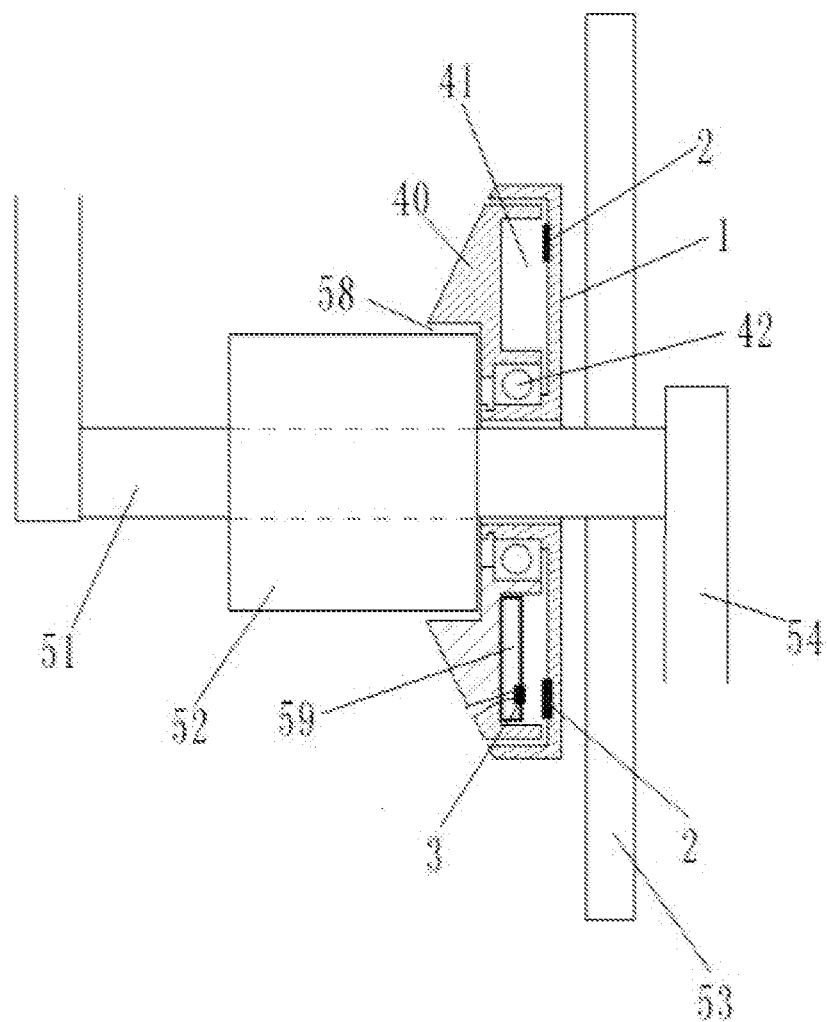
FIG. 3 is a sectional view of connection of a casing of a medial shaft of a bicycle and a sensor.
Figure 4:
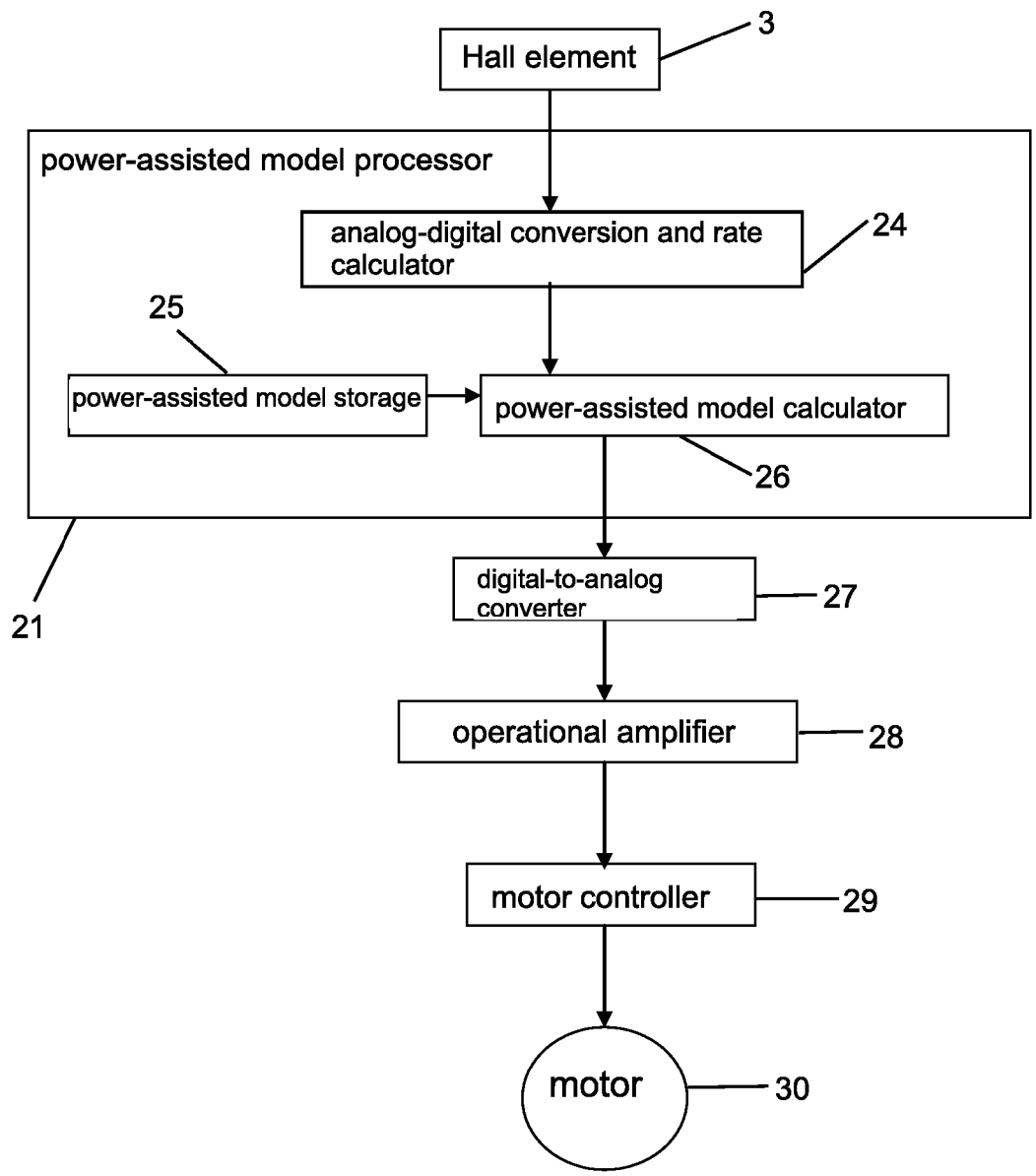
FIG. 4 is sketch view of signal flow of a Hall element, a power assistance model processor, a digital-to-analog converter and an operational amplifier.
Figure 6:
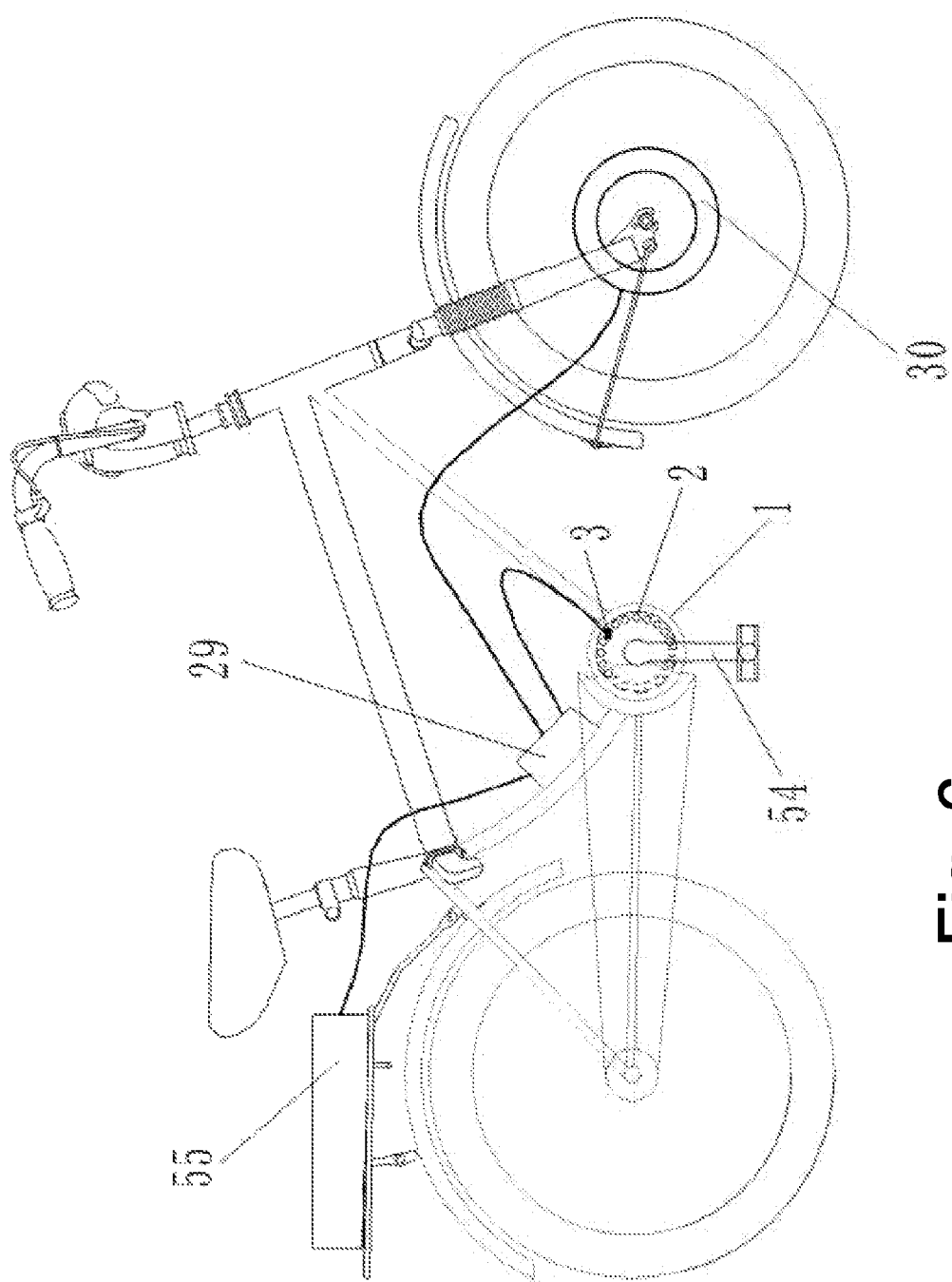
FIG. 6 is a connection relationship view of the sensor provided on the medial shaft of the electric bicycle to form the power-assistance bicycle of the present invention.

Power-assistance bicycle using a sensor having multiple magnet blocks evenly distributed in housing. Referring to FIGS. 1, 3, 4 and 6 of the drawings, the sensor is provided on a medial shaft 51 of a conventional electric bicycle. A signal output line of the sensor is connected with a motor controller 29 of the electric bicycle, so as to obtain the power-assistance bicycle of the present invention.

Parts and structures of the electric bicycle related to installation of the sensor are as follows.

A power-assistance bicycle using a sensor having multiple magnet blocks evenly distributed in a housing comprises: an electric bicycle and a sensor;

wherein the electric bicycle has a medial shaft 51, a casing 52 is sleeved on a middle section of the medial shaft 51, the medial shaft 51 is rotationally connected with the casing 52;

a chain wheel 53 is fixed on the medial shaft 51, and two pedals 54 are respectively fixed on two ends of the medial shaft 51;

a battery 55 is connected with a motor controller 29, and the motor controller 29 is connected with a motor 30 on a wheel of the power-assistance bicycle;

A structure of the sensor and connections of elements thereof are:

the sensor according to the embodiment comprises a sensing element, a power assistance model processor 21, a digital-to-analog converter 27, and an operational amplifier 28 connected in sequence;

[1] the sensing element is adapted for transforming rotational motions of an annular-groove rotating disk 1 to rectangular wave output signals;

wherein a concave of the annular-groove rotating disk 1 is opposite to that of the annular-groove fixing disk 40, and shapes thereof cooperate with each other, in such a manner that the annular-groove fixing disk 40 is inserted into an annular groove of the annular-groove rotating disk 1 to form a fitting interior-empty housing in which two disks are capable of relatively rotating with each other, the concave of the annular-groove rotating disk 1 and that of the annular-groove fixing disk 40 form a hollow ring 41; twenty permanent magnetic blocks 2 are fixedly arranged on a portion of the annular-groove rotating disk 1 within the hollow ring 41. The annular-groove rotating disk 1 and the annular-groove fixing disk 40 are formed by injecting high-strength plastics.

A diameter of the annular-groove rotating disk 1 in the hollow ring 41 is 10.0 cm. Twenty permanent magnetic blocks 2, each of which has a diameter of 0.8 cm and a magnetic flux of 146~279(B·H)max/KJ·m$^{-3}$, are provided on the annular-groove rotating disk 1. Structures of the annular-groove rotating disk 1, the permanent magnetic blocks 2 and the Hall element 3 are as follows.

All the permanent magnetic blocks 2 are evenly distributed in a circular trajectory. Each of the permanent magnetic blocks is fixed on a circular trajectory 5 having a diameter of 9.0 cm. That is to say distances of all permanent magnetic blocks 2 to a center of the circular trajectory 5 are identical, lengths of two adjacent permanent magnetic block intervals are identical.

Among all the permanent magnetic blocks 2 on a surface of the annular-groove rotating disk 1, magnetic polarities of every two adjacent permanent magnetic blocks 2 are opposite, the magnetic polarities of the adjacent permanent magnetic blocks 2 on the annular-groove rotating disk 1 are distributed in a pattern of pole N, pole S, pole N, pole S, pole N, pole S . . . .

The Hall element 3 is fixedly located on a portion of the annular-groove fixing disk 40 within the hollow ring 41, and a signal output wire passes through the annular-groove fixing disk 40. The Hall element 3 is near the permanent magnetic blocks 2, which means that the Hall element 3 is provided on the circular trajectory 5 where the permanent magnetic blocks 2 are. The Hall element 3 keeps a 0.3 cm-distance from each permanent magnetic block 2 in a moving state, in such a manner that when the permanent magnetic block 2 passes by, the Hall element 3 generates and outputs a corresponding rectangle wave electrical signal.

A center hole is provided at a center of a circular range of the circular trajectory 5 of the permanent magnetic blocks 2 on the annular-groove rotating disk 1, for coating on a medial shaft 51 of the pedal.

[2] The power assistance model processor 21 is a signal form converter adapted for converting rotating digital signals of the annular-groove rotating disk 1 to power assistance model digital signals;

wherein the power assistance model processor 21 comprises an analog-digital conversion and rate calculator 24, a power assistance model storage 25 and a power assistance model calculator 26;

the analog-to-digital conversion and rate calculator 24 is connected with the Hall element 3, the analog-to-digital conversion and rate calculator 24 calculates rectangular wave signals inputted by the Hall element 3 to obtain rates of change for representing a rotating speed of the annular-groove rotating disk 1;

the analog-to-digital conversion and rate calculator 24 is connected with the power assistance model calculator 26, and the power assistance model storage 25 is also connected with the power assistance model calculator 26, the power assistance model calculator 26 selects a certain power assistance model function of the power assistance model storage 25 via the rotation rate of the annular-groove rotating disk 1 of the analog-to-digital conversion and rate calculator 24 and the rotation rate of the annular-groove rotating disk 1 calculated by the analog-to-digital conversion and rate calculator 24 of the annular-groove rotating disk 1 is inputted into the power assistance model function to calculate a suitable power assistance model digital signal, that is to say, that the power assistance model calculator 26 outputs the power assistance model digital signals;

[3] the digital-to-analog converter 27 is adapted for converting the power assistance model digital signals to power assistance model analog signals;

wherein the power assistance model calculator 26 is connected with the digital-to-analog converter 27, and the digital-to-analog converter 27 converts the power assistance model digital signals of the power assistance model calculator 26 to the power assistance model analog signals;

[4] the operational amplifier 28 is adapted for converting the power assistance model analog signals of the digital-to-analog converter 27 to power assistance model analog signals within a rated voltage range.

The digital-to-analog converter 27 is connected with the operational amplifier 28, the power assistance model analog signals of the digital-to-analog converter 27 resolve the power assistance model problem, but the voltage of the power assistance model signal still cannot meet the demand of the motor controller 29. Therefore, the power assistance model analog signals are converted to the power assistance model analog signals needed by the rated voltage range via the operational amplifier 28, and then are transmitted to the motor controller 29, in such a manner that the motor controller 29 controls the motor 30 for power assistance.

Connections of the sensor and the power-assistance bicycle are as follows.

The annular-groove rotating disk 1 and the annular-groove fixing disk 40 are respectively sleeved outside a medial shaft 51 of the electric bicycle. The annular-groove fixing disk 40 is fixedly mounted on the casing 52 of the medial shaft 51. The annular-groove rotating disk 1 of the sensor is mounted on the medial shaft 51 of the electric bicycle. The annular-groove rotating disk 1 rotates synchronously with the medial shaft 51. The annular-groove rotating disk 1 is sleeved outside the annular-groove fixing disk 40 to form an inserted rotation connection. The annular-groove rotating disk 1 and the medial shaft 51 have a common rotation center. A signal output wire of the operational amplifier 28 is connected with a signal input end of the motor controller 29 of the electric bicycle, in such a manner that the permanent magnetic blocks 2 on the annular-groove rotating disk 1 rotates synchronously with the medial shaft 51, and that the permanent magnetic blocks 2 rotates synchronously with the pedal 54 of the bicycle, so the magnetic blocks 2 and the pedal are rotated in an identical angle and identical velocity. The Hall element 3 transmits electric signals sensing rotation velocity of the permanent magnetic blocks 2, i.e., electric signals representing the rotation velocity of the pedal 54, to the power assistance model processor 21 for electronic components on the circuit board, the digital-to-analog converter 27 and the operational amplifier 28 for signal processing. The operational amplifier 28 is connected with the motor controller 29 of the electric bicycle, in such a manner that an object of controlling the electric bicycle utilizing electrical signals by the sensor is achieved. That is to say, utilizing the power-assisted model analog signals of the operational amplifier 28, or named a standard power-assisted model analog signal, to control the electric bicycle for obtaining the power-assistance bicycle.

Since the power-assisted model analog signal outputted by the operational amplifier 28 is capable of making the movement of the motor 30 of the power-assistance bicycle meet the requirements of the rider, the power-assistance bicycle in this preferred embodiment is a man-machine cooperated power-assistance bicycle.

Embodiment 2

Figure 2:
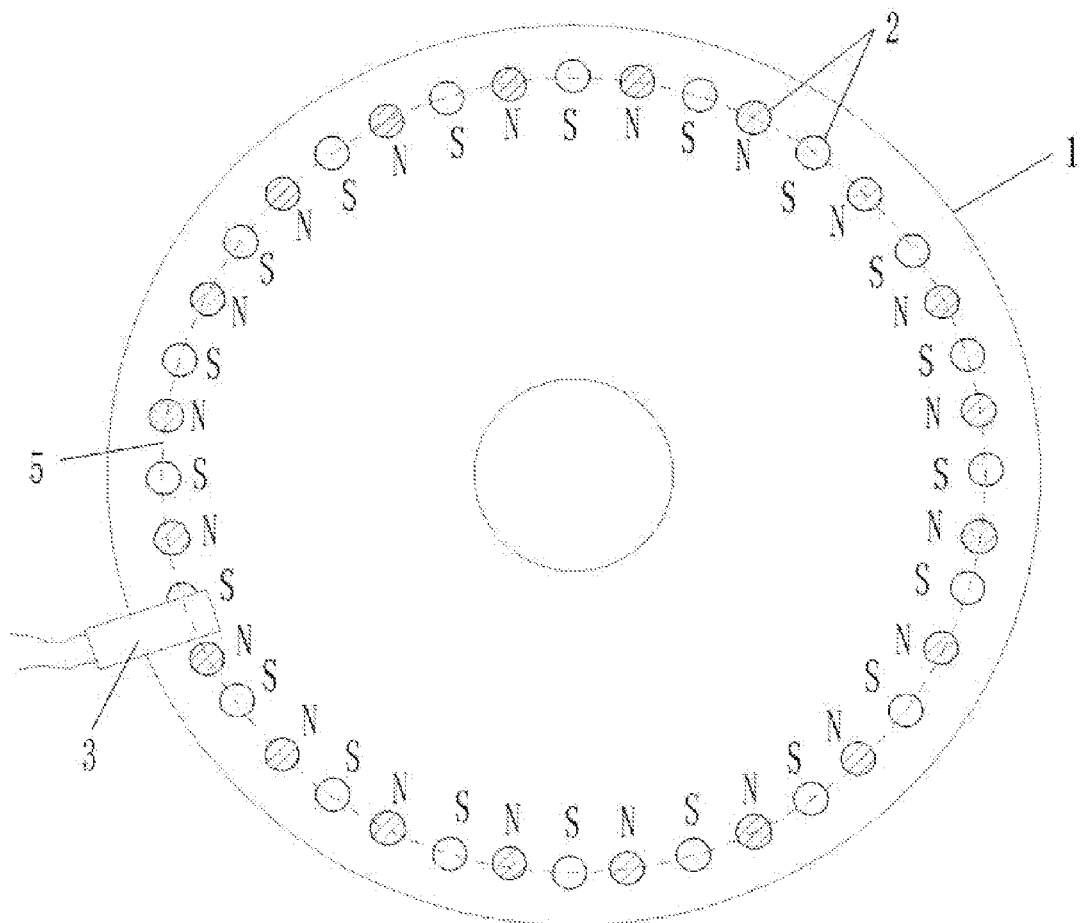
FIG. 2 is a sensing element sketch view of a plurality of N-S alternating permanent magnetic blocks with high density on the annular-groove rotating disk.

Power-assistance bicycle using high density sensor with magnetic blocks evenly distributed in housing Referring to FIGS. 2, 3, 4 and 6, of the drawings, a diameter of the annular-groove rotating disk 1 in the hollow ring 41 is 10.0 cm. Forty permanent magnetic blocks 2, each of which has a diameter of 0.6 cm and a magnetic flux of 146~279 $(B \cdot H)max/KJ \cdot m^{-3}$, are provided on the annular-groove rotating disk 1. The Hall element 3 keeps a 0.2 cm-distance from each permanent magnetic block 2 in a moving state, in such a manner that when the permanent magnetic block 2 passes by, the Hall element 3 generates and outputs a corresponding rectangle wave electrical signal. Other structures of the annular-groove rotating disk 1, the permanent magnetic blocks 2 and the Hall elements 3 are the same with those of the embodiment 1.

Embodiment 3

Figure 5:
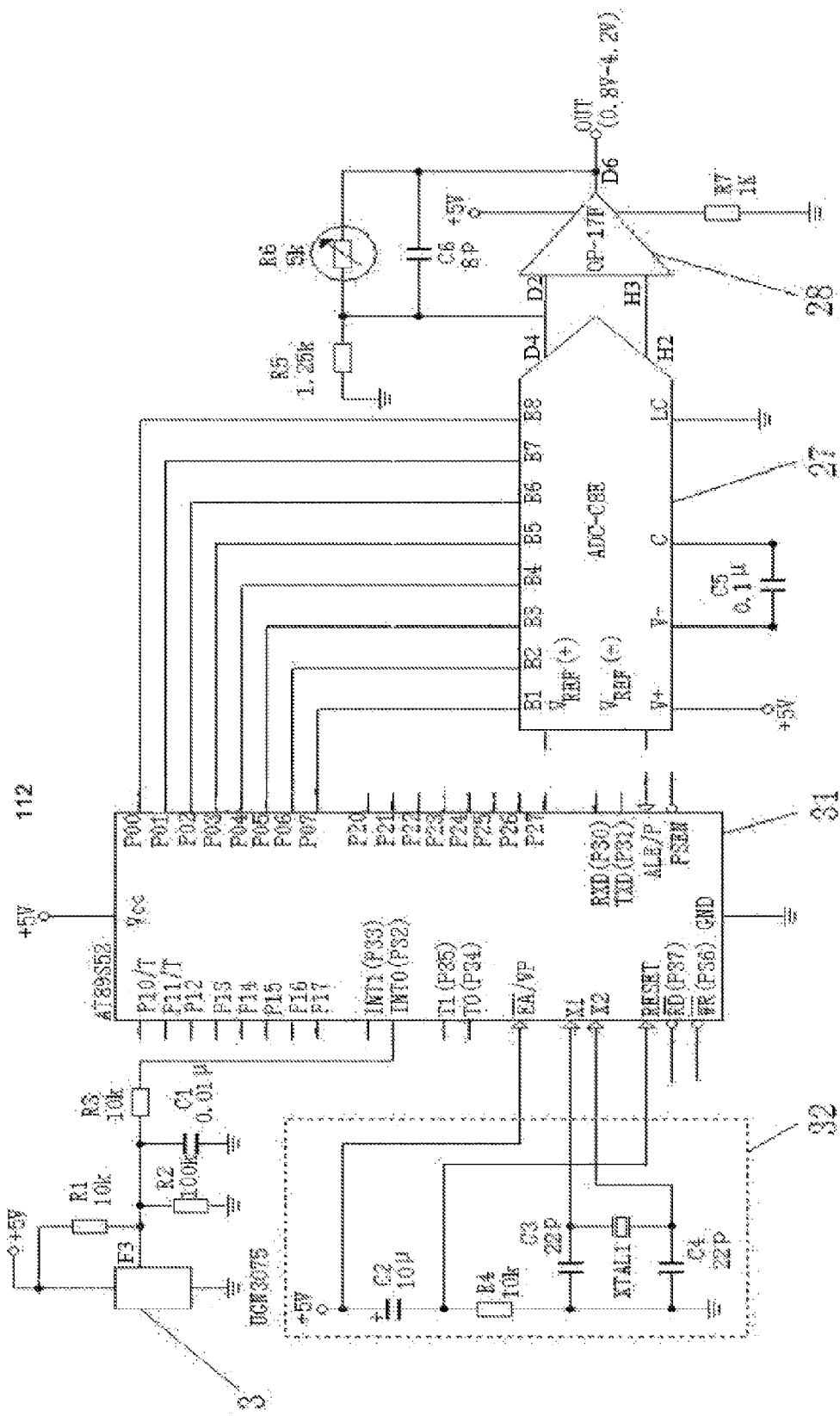
FIG. 5 is a schematic view of the Hall element, a single chip microcomputer, the digital-to-analog converter and the operational amplifier.

Power-assistance bicycle using sensor with magnetic blocks evenly distributed in housing with specific circuits Referring to FIGS. 1, 3, 5 and 6 of the drawings, the sensor according to the embodiment comprises a sensing element, a power assistance model processor 21, a digital-to-analog converter 27, and an operational amplifier 28 connected in sequence, which is identical to the preferred embodiment 1.

[1] In the sensing element, the Hall element 3 is UGN3075; other elements and element structures are the same with that of the embodiment 1.

[2] The power assistance model processor 21 is a single chip microcomputer 31, and the single chip microcomputer 31 is AT89S52, which means that the AT89S52 single chip microcomputer 31 completes functions of the analog-digital conversion and rate calculator 24, the power assistance model storage 25, and the power assistance model calculator 26.

[3] The digital-to-analog converter 27 is ADC-C8E.

[4] The operational amplifier 28 is OF-17F, a thermal resistor R6 with a resistance of 5 k is connected between an input pin D2 and an output pin D6 of the OF-17F operational amplifier 28, and a capacitor C6 with a capacitance of 8 P is connected to two ends of the thermal resistor R6 in parallel; and a resistor R5 with a resistance of 1.25 k is connected between a pin D4 of the digital-to-analog converter 27 and the pin D2 of the operational amplifier 28 for grounding, in such a manner that a voltage range of the analog signals outputted by the pin D6 of the operational amplifier 28 is capable of being adjusted by the thermal resistor R6 to 0.8~4.2V.

A connection relationship of every electronic component is as follows:

an output pin F3 of the Hall element 3 is connected to a pin INTO [P32], of the single chip microcomputer 31;

a pin P00, of the single chip microcomputer 31 is connected to a pin B8, of the digital-to-analog converter 27;

a pin P01, of the single chip microcomputer 31 is connected to a pin B7, of the digital-to-analog converter 27;

a pin P02, of the single chip microcomputer 31 is connected to a pin B6, of the digital-to-analog converter 27;

a pin P03, of the single chip microcomputer 31 is connected to a pin B5, of the digital-to-analog converter 27;

a pin P04, of the single chip microcomputer 31 is connected to a pin B4, of the digital-to-analog converter 27;

a pin P05, of the single chip microcomputer 31 is connected to a pin B3, of the digital-to-analog converter 27;

a pin P06, of the single chip microcomputer 31 is connected to a pin B2, of the digital-to-analog converter 27;

a pin P07, of the single chip microcomputer 31 is connected to a pin B1, of the digital-to-analog converter 27;

a pin D4 of the digital-to-analog converter 27 is connected to the pin D2 of the operational amplifier 28;

a pin H2 of the digital-to-analog converter 27 is connected to a pin H3 of the operational amplifier 28; and the pin D6 of the operational amplifier 28 is an analog signal output terminal.

A structure of mechanical elements and sensing elements of the sensor is: the mechanical elements of the sensor are the annular-groove rotating disk 1 and the annular-groove fixing disk 40 engaged with each other; the sensing elements of the sensor are a plurality of permanent magnetic blocks 2, the Hall element 3, the single chip microcomputer 31, the digital-to-analog converter 27, and the operational amplifier 28; wherein among the sensing elements, the Hall element 3, the single chip microcomputer 31, the digital-to-analog converter 27, and the operational amplifier 28, which are connected in sequence, are provided on a circuit board 59; a plurality of permanent magnetic blocks 2 are provided on an internal wall of the annular-groove rotating disk 1 of the hollow ring 41, and the circuit board 59 is mounted on an internal wall of the annular-groove fixing disk 40 of the hollow ring 41; the Hall element 3 on the circuit board 59 is provided at a position where the Hall element 3 senses magnetic fluxes of the permanent magnetic blocks 2 and outputs electrical signals according to magnetic flux changes. The sensing elements are sensing functional parts of the sensor. The mechanical elements have two functions: firstly, keeping relative positions of the elements of the sensing elements for forming a sensing functional integral with the elements; secondly, mounting the sensing functional integral on an electric bicycle and enabling the sensing functional integral to sense a moving state of the electric bicycle. Providing the Hall elements 3, the single chip microcomputer 31, the digital-to-analog converter 27, and the operational amplifier 28, which are connected in sequence, on the circuit board 59 is conducive to integration, modularization and miniaturization thereof, as well as mounting the four elements on the internal wall of the annular-groove fixing disk 40 of the hollow ring 41 as a whole, for simplifying manufacturing of the sensor.

What is claimed is:

1. A power-assistance bicycle, using a sensor having multiple magnet blocks evenly distributed in a housing of the power-assistance bicycle, comprising: an electric bicycle and a sensor;

wherein said electric bicycle has a medial shaft (51), a casing (52) is sleeved on a middle section of said medial shaft (51), said medial shaft (51) is rotationally connected with said casing (52);

a chain wheel (53) is fixed on said medial shaft (51), and two pedals (54) are respectively fixed on two ends of said medial shaft (51);

a battery (55) is connected with a motor controller (29), and said motor controller (29) is connected with a motor (30) on a wheel of said power-assistance bicycle;

wherein said sensor comprises a sensing element, a power assistance model processor (21), a digital-to-analog converter (27) and an operational amplifier (28) connected in sequence, wherein said sensing element is adapted for transforming rotational motions of an annular-groove rotating disk (1) to rectangular wave output signals;

wherein said sensing element comprises said annular-groove rotating disk (1), an annular-groove fixing disk (40), a Hall element (3) and a plurality of permanent magnetic blocks (2) which have identical sizes, identical shapes and identical magnetic flux; a concave of said annular-groove rotating disk (1) is opposite to a concave of said annular-groove fixing disk (40), and said annular-groove fixing disk 40 is inserted into an annular groove of said annular-groove rotating disk (1) to form a fitting interior-empty housing in which two disks are capable of relatively rotating with each other, said concave of said annular-groove rotating disk (1) and said concave of said annular-groove fixing disk (40) form a hollow ring (41); said plurality of permanent magnetic blocks (2) are fixedly arranged on a portion of said annular-groove rotating disk (1) within said hollow ring (41), and said plurality of permanent magnetic blocks (2) are distributed along a circular trajectory, wherein:

distances of all permanent magnetic blocks (2) to a center of said circular trajectory (5) are identical;

lengths of two adjacent permanent magnetic block intervals are identical;

pole N and pole S of each permanent magnetic block (2) are respectively provided on two surfaces of said annular-groove rotating disk (1), magnetic polarities of every two adjacent permanent magnetic blocks (2) are opposite, said magnetic polarities of said adjacent permanent magnetic blocks (2) on said annular-groove rotating disk (1) are distributed in a pattern of pole N, pole S, pole N, pole S, pole N, pole S;

said Hall element (3) is fixedly located on a portion of said annular-groove fixing disk (40) within said hollow ring (41), and is located at a position which is close to said permanent magnetic blocks (2) and capable of inducting said magnetic flux of each of said permanent magnetic blocks (2), a distance is provided between said Hall element (3) and said permanent magnetic blocks (2); said Hall element (3) is adapted for generating said rectangular wave output signals under two opposite magnetic polarities;

said power assistance model processor (21) is a signal form converter adapted for converting rotating digital signals of said annular-groove rotating disk (1) to power assistance model digital signals;

wherein said power assistance model processor (21) comprises an analog-digital conversion and rate calculator (24), a power assistance model storage (25) and a power assistance model calculator (26);

said analog-to-digital conversion and rate calculator (24) is connected with said Hall element (3), said analog-to-digital conversion and rate calculator (24) calculates rectangular wave signals inputted by said Hall element (3) to obtain rates of change for representing a rotating speed of said annular-groove rotating disk (1);

said analog-to-digital conversion and rate calculator (24) is connected with said power assistance model calculator (26), and said power assistance model storage (25) is also connected with said power assistance model calculator (26);

said power assistance model calculator (26) selects a certain power assistance model function of said power assistance model storage (25) via said rotation rate of said annular-groove rotating disk (1) of said analog-to-digital conversion and rate calculator (24) and said rotation rate of said annular-groove rotating disk (1) calculated by said analog-to-digital conversion and rate calculator (24) of said annular-groove rotating disk (1) is inputted into said power assistance model function to calculate a power assistance model digital signal, said power assistance model calculator (26) outputs said power assistance model digital signals;

said digital-to-analog converter (27) is adapted for converting said power assistance model digital signals to power assistance model analog signals;

wherein said power assistance model calculator (26) is connected with said digital-to-analog converter (27), and said digital-to-analog converter (27) converts said power assistance model digital signals of said power assistance model calculator (26) to said power assistance model analog signals;

wherein said sensor comprises a mechanical part and a sensing part, said annular-groove rotating disk (1) and said annular-groove fixing disk (40) are respectively sleeved outside said medial shaft (51) of said electric bicycle, said annular-groove fixing disk (40) is fixedly mounted on said casing (52) of said medial shaft (51), said annular-groove rotating disk (1) of said sensor is mounted on said medial shaft (51) of said electric bicycle, said annular-groove rotating disk (1) rotates synchronously with said medial shaft (51), said annular-groove rotating disk (1) is sleeved outside said annular-groove fixing disk (40) to form an inserted rotation connection, said annular-groove rotating disk (1) and said medial shaft (51) have a common rotation center, and a signal output wire of said operational amplifier (28) is connected with a signal input end of said motor controller (29) of said electric bicycle.

2. The power-assistance bicycle, as recited in claim 1, further comprising a thermal resistor (R6), wherein said thermal resistor (R6) is connected between an input terminal and an output terminal of said operational amplifier (28).

3. The power-assistance bicycle, as recited in claim 2, wherein said power assistance model processor (21) is a single chip microcomputer (31), and a clock circuit (32) is connected to said single chip microcomputer (31);

said sensor comprises said annular-groove rotating disk (1) and said annular-groove fixing disk (40) engaged with each other; said sensing elements of said sensor are said plurality of permanent magnetic blocks (2), said Hall element (3), said single chip microcomputer (31), said digital-to-analog converter (27), and said operational amplifier (28); wherein among said sensing elements, said Hall element (3), said single chip microcomputer (31), said digital-to-analog converter (27), and said operational amplifier (28), which are connected in sequence, are provided on a circuit board (59); said plurality of permanent magnetic blocks (2) are provided on an internal wall of said annular-groove rotating disk (1) of said hollow ring (41), and said circuit board (59) is mounted on an internal wall of said annular-groove fixing disk (40) of said hollow ring (41); said Hall element (3) on said circuit board (59) is provided at a position where said Hall element (3) senses magnetic fluxes of said permanent magnetic blocks (2) and outputs electrical signals according to magnetic flux changes.

4. The power-assistance bicycle, as recited in claim 3, wherein connection relationships of said Hall element (3), said single chip microcomputer (31), said digital-to-analog converter (27) and operational amplifier (28) are as follows:

an output pin of said Hall element (3) is connected to a first pin, of said single chip microcomputer (31);

a second pin of said single chip microcomputer (31) is connected to a first pin, of said digital-to-analog converter (27);

a third pin of said single chip microcomputer (31) is connected to a second pin of said digital-to-analog converter (27);

a fourth pin of said single chip microcomputer (31) is connected to a third pin of said digital-to-analog converter (27);

a fifth pin of said single chip microcomputer (31) is connected to a fourth pin of said digital-to-analog converter (27);

a sixth pin of said single chip microcomputer (31) is connected to a fifth pin of said digital-to-analog converter (27);

a seventh pin of said single chip microcomputer (31) is connected to a sixth pin of said digital-to-analog converter (27);

an eighth pin, of said single chip microcomputer (31) is connected to a seventh pin of said digital-to-analog converter (27);

a ninth pin of said single chip microcomputer (31) is connected to an eighth pin of said digital-to-analog converter (27);

a ninth pin of said digital-to-analog converter (27) is connected to a first pin of said operational amplifier (28);

a tenth pin of said digital-to-analog converter (27) is connected to a second pin of said operational amplifier (28); and a third pin of said operational amplifier (28) is an analog signal output terminal.

5. The power-assistance bicycle, as recited in claim 4, wherein a bearing (42) is provided between an external surface of an internal ring of said annular-groove fixing disk (40) and an internal surface of an internal ring of said annular-groove rotating disk (1).

6. The power-assistance bicycle, as recited in claim 5, wherein a circular depression (58) is provided on an outer surface of said annular-groove fixing disk (40) of said sensor; said circular depression (58) clamps on said casing (52) outside said medial shaft (51) of said electric bicycle, in such a manner that said casing (52) is clamped and fixedly connected in said circular depression (58).

7. The power-assistance bicycle, as recited in claim 5, wherein the Hall element (3) is provided opposite to the circular trajectory (5) of said permanent magnetic blocks (2).

8. The power-assistance bicycle, as recited in claim 5, wherein a center hole is provided at a center of a circular range of said circular trajectory (5) of said permanent magnetic blocks (2) on said annular-groove rotating disk (1).

9. The power-assistance bicycle, as recited in claim 5, wherein said annular-groove rotating disk (1) is a board made of a non-magnetic plastic, aluminum or copper.

10. The power-assistance bicycle, as recited in claim 3, wherein a bearing (42) is provided between an external surface of an internal ring of said annular-groove fixing disk (40) and an internal surface of an internal ring of said annular-groove rotating disk (1).

11. The power-assistance bicycle, as recited in claim 10, wherein a circular depression (58) is provided on an outer surface of said annular-groove fixing disk (40) of said sensor;

said circular depression (58) clamps on said casing (52) outside said medial shaft (51) of said electric bicycle, in such a manner that said casing (52) is clamped and fixedly connected in said circular depression (58).

12. The power-assistance bicycle, as recited in claim 10, wherein the Hall element (3) is provided opposite to the circular trajectory (5) of said permanent magnetic blocks (2).

13. The power-assistance bicycle, as recited in claim 2, wherein a bearing (42) is provided between an external surface of an internal ring of said annular-groove fixing disk (40) and an internal surface of an internal ring of said annular-groove rotating disk (1).

14. The power-assistance bicycle, as recited in claim 13, wherein a circular depression (58) is provided on an outer surface of said annular-groove fixing disk (40) of said sensor; said circular depression (58) clamps on said casing (52) outside said medial shaft (51) of said electric bicycle, in such a manner that said casing (52) is clamped and fixedly connected in said circular depression (58).

15. The power-assistance bicycle, as recited in claim 13, wherein the Hall element (3) is provided opposite to the circular trajectory (5) of said permanent magnetic blocks (2).

16. The power-assistance bicycle, as recited in claim 1, wherein a bearing (42) is provided between an external surface of an internal ring of said annular-groove fixing disk (40) and an internal surface of an internal ring of said annular-groove rotating disk (1).

17. The power-assistance bicycle, as recited in claim 16, wherein a circular depression (58) is provided on an outer surface of said annular-groove fixing disk (40) of said sensor; said circular depression (58) clamps on said casing (52) outside said medial shaft (51) of said electric bicycle, in such a manner that said casing (52) is clamped and fixedly connected in said circular depression (58).

18. The power-assistance bicycle, as recited in claim 16, wherein the Hall element (3) is provided opposite to the circular trajectory (5) of said permanent magnetic blocks (2).

19. The power-assistance bicycle, as recited in claim 16, wherein a center hole is provided at a center of a circular range of said circular trajectory (5) of said permanent magnetic blocks (2) on said annular-groove rotating disk (1).

20. The power-assistance bicycle, as recited in claim 16, wherein said annular-groove rotating disk (1) is a board made of a non-magnetic plastic, aluminum or copper.

* * * * *